(12) United States Patent
Eriksson et al.

(10) Patent No.: US 8,787,412 B2
(45) Date of Patent: Jul. 22, 2014

(54) METHOD FOR CALIBRATING A TUNABLE LASER

(75) Inventors: Urban Eriksson, Bromma (SE); Robert Lewén, Tyresö (SE); Jan-Olof Wesström, Stockholm (SE); Filip Öhman, Örsundsbro (SE)

(73) Assignee: Syntune AB, Kista (SE)

( * ) Notice: Subject to any disclaimer, the term of this patent is extended or adjusted under 35 U.S.C. 154(b) by 0 days.

(21) Appl. No.: 13/877,349

(22) PCT Filed: Oct. 5, 2011

(86) PCT No.: PCT/SE2011/051191
§ 371 (c)(1),
(2), (4) Date: May 30, 2013

(87) PCT Pub. No.: WO2012/047170
PCT Pub. Date: Apr. 12, 2012

(65) Prior Publication Data
US 2013/0243014 A1 Sep. 19, 2013

(30) Foreign Application Priority Data
Oct. 6, 2010 (SE) ....................................... 1051047

(51) Int. Cl.
*H01S 3/10* (2006.01)
(52) U.S. Cl.
USPC ................... 372/20; 372/28; 372/32; 372/33; 372/43.01; 372/50.11
(58) Field of Classification Search
USPC ................ 372/20, 28, 32–33, 43.01
See application file for complete search history.

(56) References Cited

U.S. PATENT DOCUMENTS

| 6,504,856 | B1 | 1/2003 | Broberg et al. |
| 6,658,033 | B1 | 12/2003 | Andersson |
| 6,807,204 | B1 | 10/2004 | O' Dowd |
| 2005/0100065 | A1* | 5/2005 | Coldren et al. ............ 372/38.02 |
| 2007/0258494 | A1 | 11/2007 | Davies et al. |
| 2009/0202256 | A1* | 8/2009 | Chen ............................ 398/182 |

FOREIGN PATENT DOCUMENTS

| EP | 1 432 087 | 6/2004 |
| EP | 1 850 429 | 10/2007 |
| WO | 03/077382 | 9/2003 |
| WO | 2009/116947 | 9/2009 |

OTHER PUBLICATIONS

International Search Report dated Jan. 12, 2012, corresponding to PCT/SE2011/051191.

* cited by examiner

*Primary Examiner* — Dung Nguyen
(74) *Attorney, Agent, or Firm* — Young & Thompson (57) ABSTRACT

Method for calibrating and tuning a part wise monotonically, continuously tunable semiconductor laser having a phase section and a first Bragg reflector section, through which sections a phase current and a first reflector current, respectively, are applied, which laser is not actively cooled, includes a) a calibration step, including obtaining at least two tuning lines along which tuning lines all combinations of phase and Bragg currents are stable operating points, identifying at least one reference stable operating point along a first one of the identified tuning lines at which operating point the laser emits light at a certain reference frequency, and storing at least one reference stable operating point; and b) a subsequent tuning step, during which the output frequency of the laser in relation to the reference frequency is controlled to a desired output frequency by translating the operating point of the laser along the first tuning line.

15 Claims, 5 Drawing Sheets

METHOD FOR CALIBRATING A TUNABLE LASER

The present invention relates to a method for calibrating and tuning a tunable semiconductor laser, more precisely a tunable laser of the type DBR, MGY-DBR, SG-DBR, SSG-DBR, DS-DBR or the like, comprising at least a phase section and at least one or two Bragg reflector sections to which different currents are applied. The laser is tuned by selecting certain combinations of such currents.

In high-speed optical data communication networks, such tunable lasers are used for sending optical data signals from one end of a communication network, to be detected at another end of the network. In order to efficiently transmit data, it is vital that the laser is calibrated properly, so that the light emitted can be detected at the receiving end. Such calibration involves finding optimal operating points, associated with stable, powerful light emission and high side-mode suppression. In systems using wavelength division multiplexing this also involves tuning the laser to such optimal operating points at which the light emitted additionally is within the acceptable detection frequency range.

U.S. Pat. No. 6,658,033 discloses a method for finding hysteresis free operating points in DBR-type tunable lasers. U.S. Pat. No. 6,504,856 discloses a method for finding hysteresis free operating points within a mode plane of a laser by detecting discontinuities occurring in mode jumps. U.S. Pat. No. 6,807,204 discloses a hybrid integrated laser assembly including an optical filter, where there is a known relationship between a wavelength of an incident beam and the portion of the power transmitted by the filter. The assembly described can be calibrated using said filter.

A problem with these prior art devices and methods is that they require the laser to be kept at a constant and predetermined temperature. This normally implies cooling of the laser, typically using a thermo-electric cooler such as a peltier cooler. The use of a cooler in turn necessitates the cooled laser to be installed in a hermetically sealed package, to avoid harmful condensation from forming on the laser chip. Both the cooler itself and the hermetic package are expensive, making the whole laser module relatively expensive. Therefore, it would be advantageous to be able to calibrate a semiconductor laser without having to cool it, and then to be able to tune the laser across a broad frequency spectrum during operation without having to keep it at a predetermined, constant temperature during operation.

Furthermore, prior art devices and methods such as those referred to above require the presence of external laboratory equipment during calibration. In most cases, they also require an additional wavelength locker, i.e. temperature stabilized, frequency calibrated filters, for frequency locking during operation. Both wavelength lockers and laboratory calibration increase the cost of the package.

The present invention solves the above problems.

Thus, the present invention relates to a method for calibrating and tuning a part wise monotonically, continuously tunable semiconductor laser comprising at least a phase section and at least a first Bragg reflector section, through which sections a phase current and a first reflector current, respectively, are applied, which laser is not actively cooled, said method comprising a) a calibration step, comprising firstly obtaining at least two tuning lines along which tuning lines all combinations of phase and Bragg currents are stable operating points of the laser, secondly identifying at least one reference stable operating point along at least a first one of the identified tuning lines at which operating point the laser at its prevailing operating temperature emits light at a certain reference frequency, and thirdly storing into a memory the at least one reference stable operating point; and b) a subsequent tuning step, during which the output frequency of the laser in relation to the said reference frequency is controlled to a desired output frequency by translating the operating point of the laser along the said first tuning line according to a known relationship between relative position along the tuning line and relative laser frequency shift, and, whenever said translation from the said reference operating point is or becomes too great for the operating point to fit along the first tuning line, continuing the translation along another one of the identified tuning lines so as to achieve the desired output frequency.

In the following, the invention will be described in detail, with reference to exemplifying embodiments of the invention, and to the enclosed drawing, in which.

Figure 1:
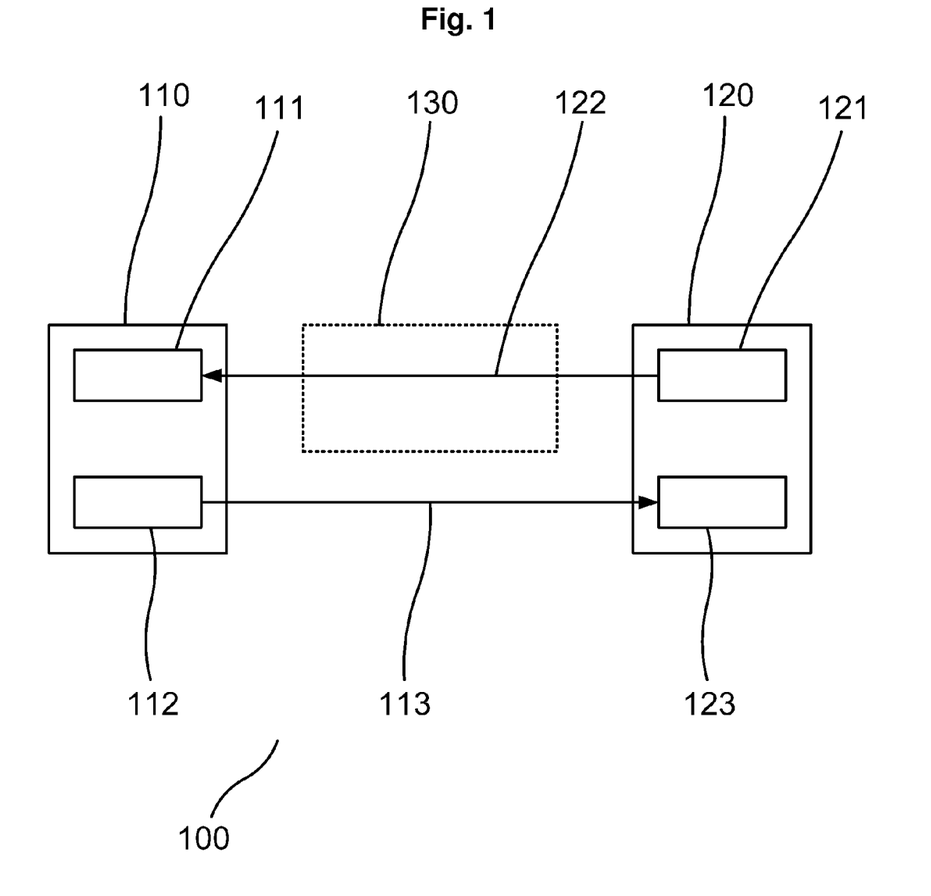
FIG. 1 is a simplified outline diagram showing an optical network in which a tunable laser is used.

FIG. 1 illustrates a receiving end 110 and a transmitting end 120 in an optical communications network 100, for example for digital communication. The network 100 could be a point to point network or part of a more complex network comprising several transmitter and receiver units. The receiving end 110 comprises an optical detector 111, arranged to read an optical signal 122, which is emitted from a tunable semiconductor laser 121 in the transmitting end 120 and sent through an optical fiber.

Between the transmitting end 120 and the receiving end 110 is an optical filter aggregate 130 arranged, comprising at least one optical frequency filter and/or frequency multiplexer. For example, the filter or filters could be part of one or several optical multiplexer/demultiplexer devices, which are standard building elements in a wavelength division multiplexed network. The filter or combination of filters will normally be associated with a certain optical frequency pass-band, covering wavelengths that can pass from the transmitting end 120 to the receiving end 110. For the purposes of the present invention, the filter aggregate 130 can be considered as a single optical filter with at least one certain pass-band.

According to a very preferred embodiment, the filter aggregate 130 comprises only already existing, conventional optical filters that are normal and necessary parts of the network 100. In this case, no additional filters are added to the network 100 for the specific purposes of the present invention. In general, it is necessary that the laser 121 is tuned to a frequency within the pass-band of the concatenated optical filters of the filter aggregate 130. Moreover, the light detector 111 of the receiving end 110 is preferably a conventional light detector.

The conventional light detector also preferably constitutes an already existing, conventional component of the network 100 in which the laser 121 is also a part.

As will be better understood from the following, such arrangement will make it possible to inexpensively calibrate the laser 121 using a method according to the present invention.

Furthermore, the receiving end 110 is arranged to feed back signals 113 to the transmitting end 120, via the above described optical fiber or a separate channel, which could be a separate optical fiber or any other communication link such as an electric wire. For example, in case the network 100 is a two-way communication network, such as a network for IP data traffic or a so-called fiber-to-the-home connection, the communication link from the receiving end 110 to the transmitting end 120 will already be present in the network 100. It is preferred that no such additional communication link is arranged, but to use an already existing, conventional one, for example the same fiber as used by the sender 120 to transmit light signals to the transmitter as described above, which fiber in this case carries signals in both directions.

In the conventional case, the required frequency of the tunable laser 121 will typically be known in advance. For example, if the receiving end 110 is a central node, it can communicate a specification of the desired frequency to the transmitting end 120. Alternatively, the frequency could be known in advance by way of network design. Then, the laser 121 would be calibrated to the specified frequency using some type of calibration table. As explained above, this would require a well defined laser temperature, extensive factory calibration of the transmitter unit and, in general, the use of a wavelength locker.

The method of the present invention can be used to calibrate any tunable semiconductor laser having at least one Bragg section. Various semiconductor laser types may incorporate different numbers and arrangements of Bragg sections. For example, the simple DBR (Distributed Bragg Reflector) laser features only one Bragg reflector, a phase section, a gain section and a cleaved facet reflector. The SG-DBR (Sampled Grating Distributed Bragg Reflector) and SSG-DBR (Super Structure Grating Distributed Bragg Grating) lasers are somewhat more complex, comprising an additional Bragg reflector with different periodicity and possibly a SOA (Semiconductor Optical Amplifier). The individually controllable Bragg reflectors admit the laser to be stepwise tunable across a broader spectrum. Another example of a widely tunable laser is the DS-DBR (Digital Supermode Distributed Bragg Reflector) laser, which features a multitude of Bragg sections.

Figure 2:
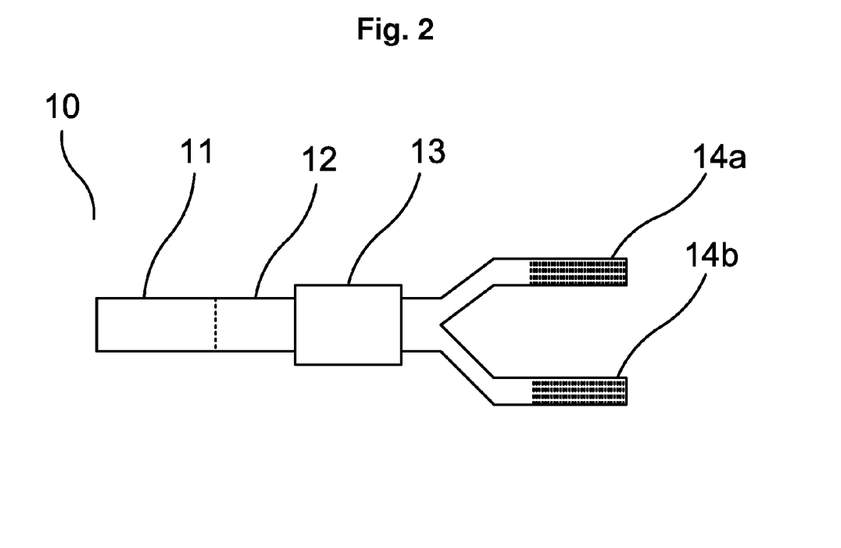
FIG. 2 is a simplified view of an MGY laser.

FIG. 2 illustrates an additional example of a semiconductor laser which is useful with the present method, namely an MGY-DBR (Modulated Grating Y-Branch Distributed Bragg Reflector) laser 10. It comprises an amplification section 11, a phase section 12, a coupler 13 and two Bragg reflector section branches 14a, 14b. Respective tuning currents are applied at least to the phase 12 and the reflector 14a, 14b sections.

According to the invention, the laser 121 is a tunable semiconductor laser of the above exemplified, general type, comprising at least a phase section and at least one or two Bragg reflector sections to which different currents can be applied in order to tune the laser 121.

Common to all such semiconductor lasers is the complex interplay between the Bragg section(s) and the phase section. In general, the Bragg current(s) need(s) to be selected in order to define the lasing wavelength. Also, the phase current needs to be selected in order for the optical length of the laser cavity to match this lasing wavelength, so that high-power, stable lasing can be achieved. To tune the laser, the Bragg and phase currents are then adjusted simultaneously to alter the lasing wavelength. The temperature dependence of the optical materials, together with ageing-induced changes, makes it a delicate task to calibrate the laser, and difficult to tune the laser to a certain absolute wavelength without using an absolute wavelength benchmark.

Such tunable lasers are furthermore generally calibrated during manufacturing, for example using the initially mentioned methods. The result of such calibration procedures is generally a set of tuning lines, along which the laser operates in a stable single mode. A tuning line is essentially a set of tuning points at which the laser operates in a stable single mode, that can for example be obtained by interpolating the settings between such tuning points. Each tuning line is constructed so that when the laser is tuned along the tuning line, the phase current is continuously adjusted and each reflector section current is adjusted accordingly to follow the tuning line. The frequencies of these tuning lines are in general calibrated by measuring the emitted frequency with a high quality wavelength meter.

Figure 3:
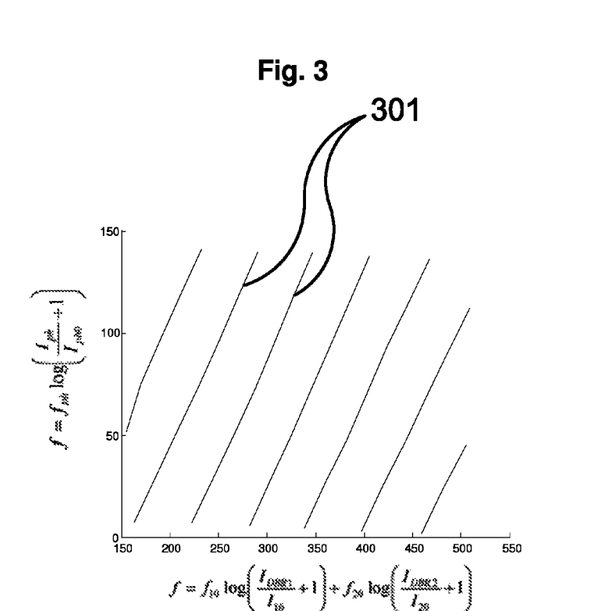
FIG. 3 is a graph showing a number of tuning lines of an MGY-SOA laser.

FIG. 3 shows an example of a set of such tuning lines 301 for a certain laser of the MGY-SOA type. On the horizontal axis of the depicted graph, the two Bragg section currents are measured. The horizontal axis has been normalized as $$f = f_{10} \log\left(\frac{I_{DBR1}}{I_{10}} + 1\right) + f_{20} \log\left(\frac{I_{DBR2}}{I_{20}} + 1\right),$$

since the relationship along a tuning line between the two Bragg section currents $I_{DBR1}$ and $I_{DBR2}$ is typically known.

The vertical axis, which corresponds to the phase current $I_{ph}$ applied to the laser, is normalized as $$f = f_{ph} \log\left(\frac{I_{ph}}{I_{ph0}} + 1\right).$$

The above described normalizations of the horizontal and vertical axes are useful since the lasing frequency is proportional to both the reflector currents and to the phase current. After normalization, both axes have the convenient units of GHz, so that one can directly read the nominal relative frequency shift from the graph.

By sweeping the three currents from the beginning to the end along any one of these tuning lines 301, it is possible to tune the laser frequency monotonically. However, each identified, stable tuning line has a limited extension with respect to laser output frequency, which will depend on the laser geometry and the maximum value of the tuning currents that are applied. Herein, such lasers that are monotonically, continuously tunable along one such tuning line at a time selected from a number of available, different such tuning lines is denoted "part wise monotonically, continuously tunable".

Conventionally and as described above, calibrated tuning lines are measured during manufacturing at a certain, highly stabilized laser temperature. Then, the laser is expected to operate at that same temperature.

Preferably, the laser 121 is however not actively temperature stabilized, and preferably not actively cooled. Active temperature stabilization of the laser 121 would require extra equipment. Also, as explained above, as a consequence of not being actively cooled, the laser 121 does not have to be arranged in a hermetic package, resulting in a less expensive transmitter unit. The laser 121 is, however, preferably equipped with a temperature sensor for monitoring its temperature, so that its frequency can be altered as a response to a relative shift in its operating temperature as described below.

It is also preferred that a conventional heater is arranged to heat the laser 121 during operation. Such heater can for example be one or several resistors, thermally coupled to the laser 121, in general not requiring hermetic packaging and being much less expensive than for example a peltier cooler.

According to the invention, in a first step, at least two, more preferably at least three tuning lines are obtained for a laser 121 which is to be operated using the present method. The obtaining of tuning lines can be accomplished in any manner, for example in an initial detection step using one of the initially referred to, conventional detection methods. Notably, the tuning lines may be obtained by simply taking part of a previous calibration carried out by a laser supplier and shipped with the laser.

Now, any operating point along any one of the tuning lines 301 is a stable operating point. A key insight lying behind the current invention is that the stability of such operating point, as defined in current units, is approximately independent of the temperature of the laser 121, across a wide range of temperatures on both sides of the temperature during calibration. This is because the tuning lines 301 reflect the detuning of the cavity mode relative the Bragg peaks. To first approximation both quantities will shift by the same amount as a function of temperature. This is the case for all semiconductor lasers of the types discussed above.

In practice there will, depending on the type and design of the laser 121, be a slight dependency of the correct location of the tuning lines 301 as a function of the temperature of the laser 121. However, this dependency can in general be characterized and quantified. For example, the position of the tuning lines can be detected for a range of different laser temperatures and for a certain type of laser. Such characterization will only be necessary to perform once for each laser type, since the shift of the tuning lines is systematic and laser independent. Hence, the temperature dependency can then be compensated for during tuning of the laser 121. Consequently, the tuning lines 301 identified as described above can be validly used also at other laser temperatures than the one used during calibration.

Moreover, the actual laser frequency at a certain stable operating point along a certain tuning line will depend on the laser temperature, the dependency being quantifiable beforehand and typically around −12 to −14 GHz/° C.

Hence, the tuning lines 301 will be almost independent of the actual laser temperature during the scan, however only as regards the relative frequency change, not the absolute frequency.

In order to obtain a complete calibration of the laser 121, after the above described tuning lines 301 have been determined, at least one reference stable operating point along at least one of the identified tuning lines is identified, at which operating point the laser 121 emits light at a certain reference frequency.

The purpose of identifying said reference operating point is to later be able to adjust the operating point of the laser in relation to the reference operating point in order to either arrange the laser 121 to emit light at another frequency relative the reference frequency, and/or to compensate for determinable, relative laser frequency drift, such as for example temperature drift or age-induced drift. Hence, the reference frequency need not be known in absolute terms, it must at least not be known by the laser. What is required is that the reference operating point is known, and that the laser 121 emits light at a desired reference frequency when tuned to the reference operating point, possibly requiring a certain operating temperature.

The identification of the reference operating point can be carried out in different ways. Generally, the laser 121 is scanned along at least one, preferably each identified, tuning line, and the light emitted is transmitted to a target for emitted light, which target communicates a feedback signal to a control device controlling the laser 121. The feedback signal either comprises information about the absolute frequency of the light emitted from the laser 121 or whether the said laser light is within a certain frequency range.

According to a preferred embodiment, the target is the optical detector 111 of the receiving end 110, and the feedback signal is sent from the receiving end 110 and carries information about whether any light is detected after having passed the above described filter aggregate 130 pass-band and/or the amount of light remaining after such passage. In other words, in this preferred case the reference frequency lies within the pass-band of the filter aggregate 130.

At some point during the scan, the laser wavelength will coincide with a desired operation frequency, either a desired, absolute frequency or a frequency which is within the desired frequency range.

In the case where the target is the optical detector 111, when the light emitted from the laser 121 is within the above-mentioned aggregate pass-band of the filter aggregate 130, a signal will be detected at the receiving end 110. During the scan, the receiving end 110 will send signals informing the transmitting end 120 of the power level detected by the receiving end 110 at the moment, and the reference operating point is selected so as to be indicative of the interval of operating points along which the receiving end 110 detects a light power which is larger than a certain predetermined threshold value.

Preferably, the feedback signal also comprises information about the absolute detectable frequency interval, for example in the form of the channel number of the network, or the channel number according to some specific standard, so that the transmitting end 120 can derive the exact absolute frequency limits for which the target can detect the emitted light. This way, the transmitter can deduce the absolute frequency at which it emits light when tuned to a certain operating point along a certain tuning line.

In the preferred case where the target is the receiving end 110, being able to detect emitted light across frequencies within the pass-band of the filter aggregate 130, it may not be necessary for the transmitting end 120 to be aware of the absolute frequency value at which it should emit light, since it would suffice to know the point along the tuning line 305 to use at a certain laser temperature, see below.

Figure 4:
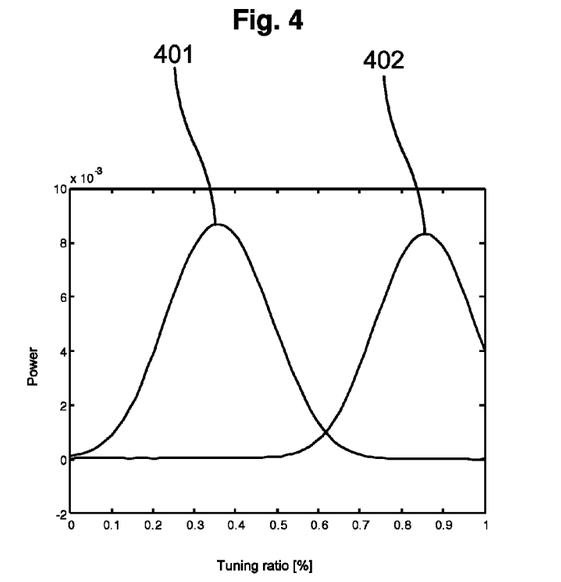
FIG. 4 is a graph illustrating the detected light during an initial calibration step according to the present invention.

FIG. 4 illustrates the detection response 401, 402 from the detector 111 in the receiving end 110 during the calibration scan along two different tuning lines. The x-axis depicts the position along the tuning line, and the y-axis depicts the measured power. As is clear from the graph, there will be a certain frequency overlap between any two tuning lines. However, the respective combination of tuning currents along two different tuning lines yielding the same laser output frequency will be different.

Alternatively or supplementary thereto, the output frequency of the laser is measured using a frequency measurement device, such as a conventional wavelength locker, which is preferably integrated in the laser module. The output signal from the frequency measurement device is then accepted as an input parameter by the above said control device during tuning.

According to a preferred embodiment, the frequency measurement device is a wavelength locker which is of glass material and built into the laser capsule. The temperature dependence of such a glass wavelength locker is about one tenth of that of for example InP, why it must not, in many applications, be temperature stabilized.

Then, at least one identified reference operating point along at least one tuning line is stored in a memory, such as a lookup table. The memory can be any conventional on-chip or external memory, preferably a digital memory. The stored value or values is then used as frequency reference during subsequent tuning of the laser 121. Namely, when tuned to the identified reference operating point at the operating temperature prevailing during calibration, the laser will emit light at the reference frequency.

As an example, one or both of the operating points along a certain scanned tuning line corresponding to the target frequency range endpoints, in other words at least one of the entry and the exit points of the allowable interval during the scan along said tuning line, is stored in the memory. Alternatively, at least the midpoint in the allowable interval, or the operating point yielding the maximum response in the target for emitted light, in the case of the network 100 of FIG. 1 the peak for the filter 130 pass-band, is stored.

In a subsequent tuning step according to the invention, the output frequency of the laser 121 in relation to the above described reference frequency is controlled to a desired output frequency by translating the operating point of the laser 121 along a certain one of the above discussed identified tuning lines 301 according to a known relationship between relative position along the tuning line and relative laser frequency shift. Moreover, whenever said translation from the reference operating point is or becomes too great for the operating point to fit along the said tuning line, the translation is continued along another one of the identified tuning lines 301 so as to achieve the desired output frequency.

According to a preferred embodiment, especially useful in case the laser 121 is not actively temperature stabilized, the temperature of the laser 121 is measured at the time when the frequency calibration measurement is carried out, and the measured temperature is also stored in a memory for subsequent reference.

During operation, the temperature of the laser 121 may depart from that prevailing during the frequency calibration. Hence, the reference stable operating point along a certain tuning line, which was for example found to be the most efficient during the frequency calibration described above may no longer be the most efficient one at the new operating temperature.

However, since the laser frequency depends on the temperature of the laser in a known way, it is possible to predictably compensate for a temperature induced frequency shift by tuning the laser along one of the identified tuning lines 301 so that the temperature induced frequency shift is counteracted. It is preferred to investigate, before the operation of a particular laser begins, the exact dependency between temperature and frequency for the specific type or category of laser to which the laser belongs, by routine experimentation. Alternatively, if detailed information on the output frequency of the laser is available in the network 100 during operation, it is preferred to use this information instead.

Thus, a tuning algorithm can be implemented such that a thermally induced frequency shift is compensated for by deliberately tuning the frequency in the opposite direction along the tuning line as soon as the temperature shifts. During operation of the laser 121, its current operating temperature is therefore measured, preferably continuously, and then the laser 121 is tuned, preferably whenever the detected temperature changes, to an operating point which is translated in relation to the previously identified and stored reference operating point along the tuning line, so as to compensate for said frequency shift in output frequency of the laser 121 due to a difference between the stored operating temperature and the measured current operating temperature. As the temperature of the laser 121 shifts, the currently used operating point along the tuning line will hence be translated by an appropriate distance in order to counteract the frequency effect of the temperature shift.

For a large temperature shift, the end of a certain tuning line may eventually be reached. In other words, the translation of the operating point along the tuning line needed to compensate the output frequency of the laser 121 for the detected temperature difference, between the current operating temperature of the laser 121 and the measured operating temperature during the above frequency calibration, is or becomes too great for the operating point to fit along the first tuning line. In this case, the tuning of the laser 121 is continued along another tuning line so as to achieve said frequency compensation in the manner described below. This way, a very broad laser temperature range, typically of at least several tens of degrees Celsius, can be covered while keeping the laser at a constant frequency.

Figure 5:
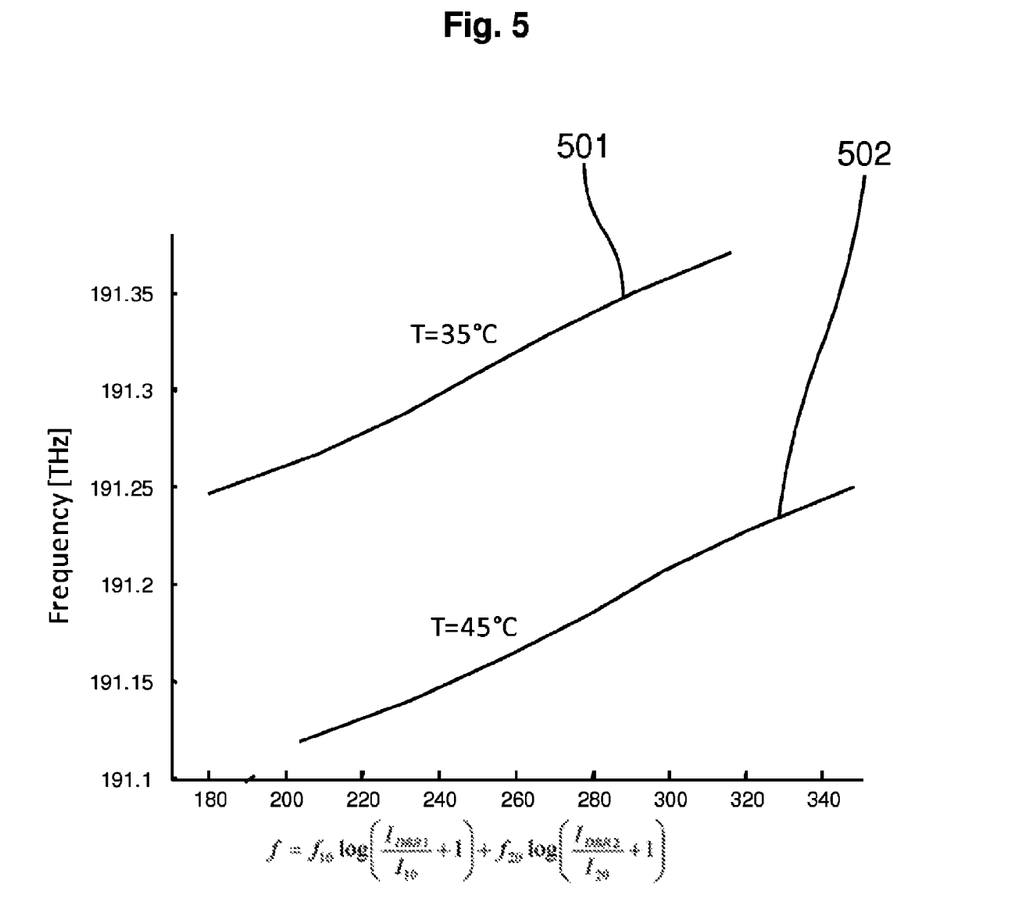
FIG. 5 is a graph illustrating a specific tuning line at two different temperatures.

FIG. 5 shows, for an MGY-SOA type laser, a certain tuning line, as measured at two different temperatures, namely at 35° C. 501 and at 45° C. 502. In the graph, the horizontal axis is normalized in the same manner as the graph in FIG. 3. The vertical axis, on the other hand, shows the absolute value of the laser 121 output frequency.

By comparing the two curves 501, 502 it becomes clear that corresponding stable operating points are shifted to lower frequencies as the laser temperature increases. The rate of the laser output frequency change for this laser type is approximately −12 GHz/° C. Moreover, the tuning line 501, 502 also moves in the horizontal direction as the temperature shifts. In the normalized units of the horizontal axis, the shift rate is approximately +3 GHz/° C. While the output frequency shift of the laser in this case is quite typical for the thermally induced refractive index change in the InGaArP material from which it is built, the shift of the tuning line 501, 502 in the horizontal direction is dependent on the structure of the laser. The example shown in FIG. 5 is representative for a buried heterostructure MGY-SOA laser. As an illustrative comparison, a corresponding laser made on a ridge structure would display a much smaller temperature dependent shift of a tuning line in the horizontal direction. It is preferred that these characteristics are determined for the type or category of laser 121 used before it is calibrated.

Figure 6:
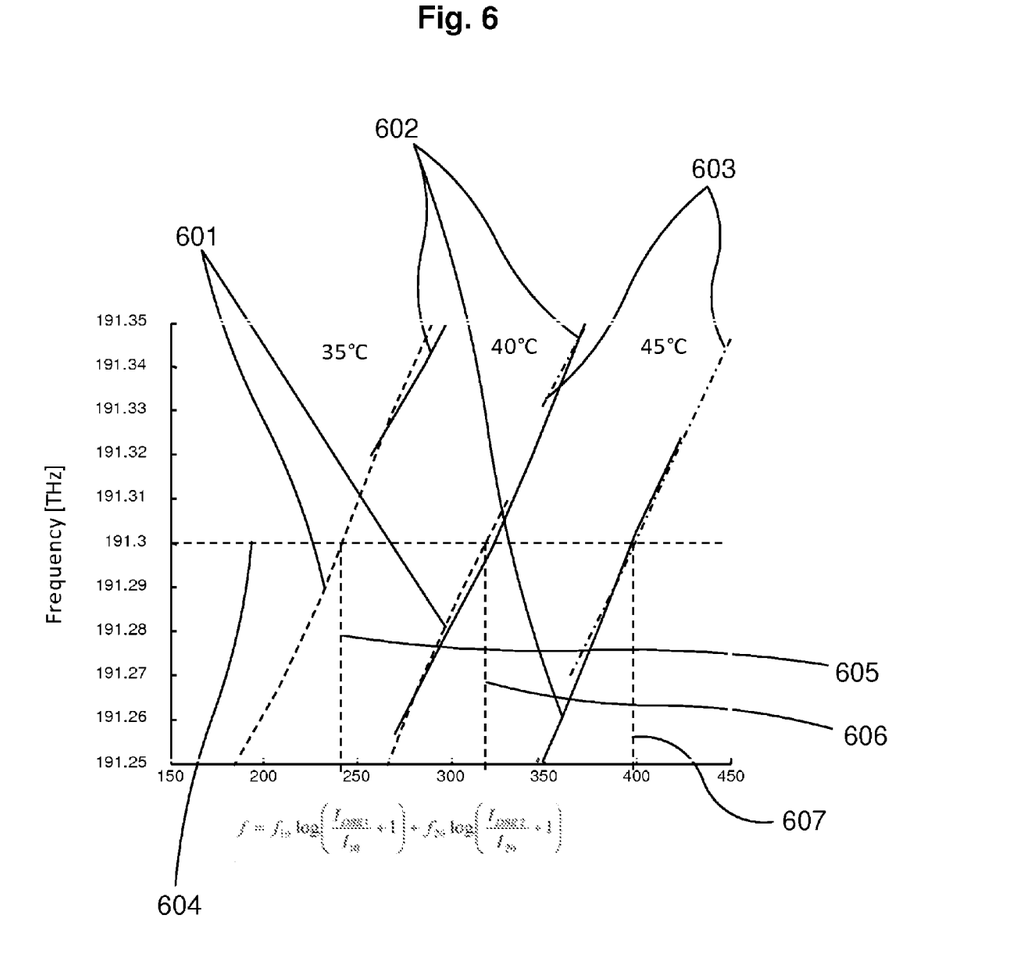
FIG. 6 is a graph illustrating three specific tuning lines at three different temperatures.

FIG. 6 shows a graph which is similar to the one of FIG. 5, but which depicts the position of several tuning lines 601 (solid lines), 602 (dotted lines), 603 (dashed and dotted lines) at three different laser temperatures 35° C., 40° C. and 45° C. The axes of FIG. 6 have the same units as those of FIG. 5.

In the following, the graph of FIG. 6 will be used to explain how the laser 121 can be tuned to a desired, stable frequency across a broad temperature interval.

Suppose the laser 121 is initially operated at a temperature of 35° C., and is tuned along the tuning line 601 to 191.3 GHz (intersection with the dotted horizontal line 604 in the graph). This would mean that the Bragg currents in normalized terms would be tuned to about 240 GHz (see left-most vertical line 605 in graph). In order for the laser to be tuned along the tuning line 601, the phase current would likewise have to be set to the proper value, see FIG. 3.

Then suppose that the temperature increases to 40° C. As a result, the frequency for that particular operating point along the tuning line 601 will decrease, as is clear from the shift of tuning line 601 in FIG. 6. In order to maintain a constant frequency, it is necessary to tune the laser 121 by moving along the tuning line 601, gradually increasing both the Bragg and the phase currents as the temperature changes. For example, at an operating temperature of 40° C., the Bragg currents in normalized terms will be about 315 GHz (middle vertical line 606).

If the temperature exceeds 40° C., the tuning line 601 will eventually come to an end. Then, according to the invention the tuning of the laser 121 continues along the next tuning line 602.

It is preferred that the tuning line 602 to which tuning is transferred in this case is the subsequent neighbor of the first tuning line 601.

Changing from one tuning line 601 to the next 602 implies switching from one cavity mode to the next, while keeping the position of the Bragg mirrors unchanged. The transfer to a new tuning line is therefore made by changing the phase current only, not the Bragg currents.

Suppose, finally, that the operating temperature of the laser 121 again increases, now to 45° C. In this case the tuning will be transferred further along the tuning line 602, to a normalized Bragg current value of about 400 GHz (right-most vertical line 607). Eventually, as temperature increases further, the tuning process will be transferred to the next cavity mode, that is the next tuning line 603.

Figure 7:
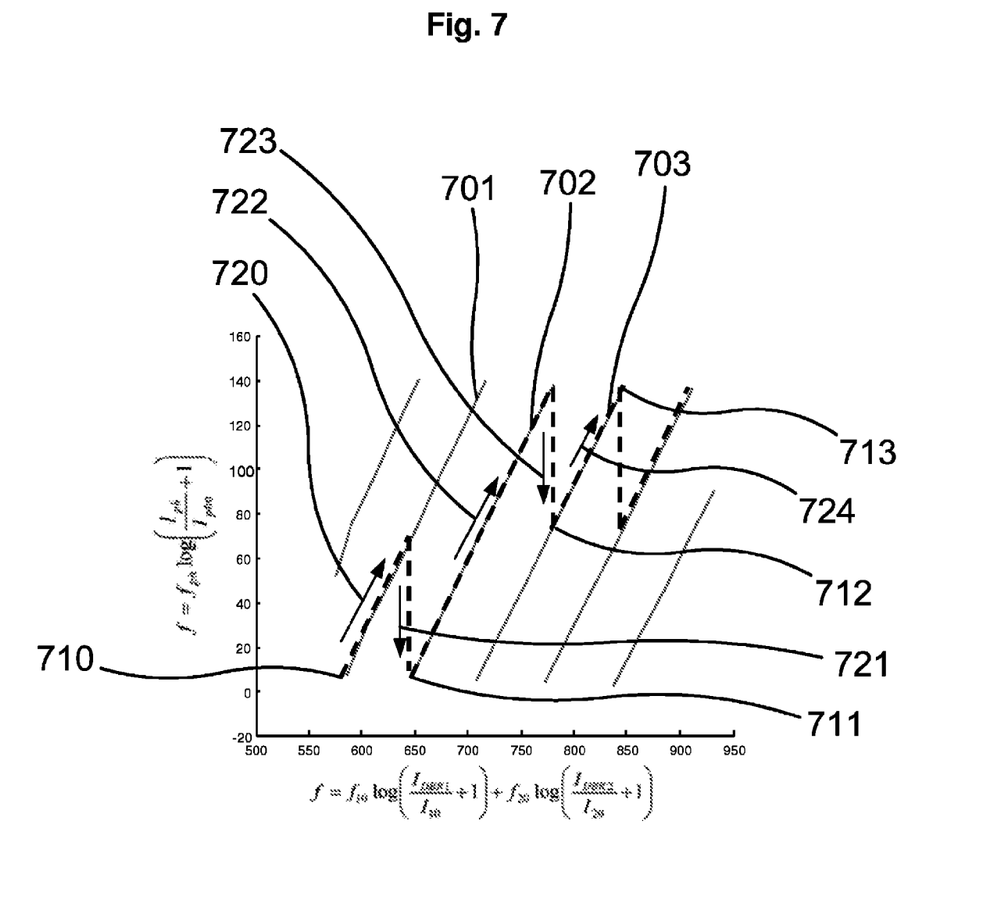
FIG. 7 is a graph illustrating different tuning lines and a tuning trajectory.

FIG. 7 shows the same tuning process described above in relation to FIG. 6, aiming at keeping a constant frequency across a broad temperature interval. In the graph of FIG. 7, the horizontal axis is measured in the same normalized units as FIG. 6. However, the unit of the vertical axis is the normalized phase current used in FIG. 3. From FIG. 7, it is clear that the transfer from one tuning line to another is accomplished by changing the phase current only.

FIG. 7 shows an initially used operating point 710 at a certain temperature and a certain lasing frequency. From there, as temperature gradually increases, the operating point of the laser is first continuously shifted, as depicted by arrow 720, along the tuning line 701 up to its end. Then, the operating point is transferred abruptly, indicated by arrow 721, to a new point 711 along the neighboring tuning line 702, which new point 711 yields the same or approximately the same laser output frequency as the operating point along the tuning line 701 used just before the transfer to the tuning line 702. As temperature continuous to increase, the operating point again continuously shifts, in the direction of arrow 722, along the tuning line 702 until the latter ends. Then, a new abrupt transfer 723 occurs, now to a point 712 along the next neighboring tuning line 703, again without a significant shift in the laser output frequency. The operating point shifts further, indicated by arrow 724, along the tuning line 703, up to the operating point 713, which is the one used when the operating temperature is 45° C.

The operating point can, of course, also be shifted in the opposite direction.

Thus, by measuring and storing at least one reference operating point and the measurement temperature as described above, the laser 121 can then be operated at a constant output frequency throughout a broad interval of operating temperatures by continuously updating the operating point of the laser. Hence, there is no need for keeping the temperature of the laser constant during operation.

Furthermore, using the same principle, stable, precise tuning across a large part of the complete tunable range of a laser can be accomplished even under varying operating temperatures. Since the dependence of the laser output frequency on the operating temperature is known, the operating point can be shifted along the tuning lines as described herein in such a way so that the output frequency of the laser is both compensated for changes in operating temperature as well as tuned to various desired frequency values. Since both the temperature compensation and a desired frequency can be expressed in relation to the at least one measured and stored frequency reference, both operations can be added one to the other and continuously applied to the laser by appropriately modifying the applied phase and Bragg currents so as to achieve reliable and tunable frequency output.

Moreover, using a method according to the present invention, the relative frequency of the laser 121 can be controlled across a broad frequency interval even under constant operating temperature. It can also be used to compensate for age-induced changes in laser frequency that are known as such, under constant or varying operating temperatures.

From FIG. 7 one can see that the tuning lines 701-703 together cover approximately almost 350 GHz, which is to first approximation sufficient to compensate for 23° C. of laser temperature change. Compared to a temperature-stabilized laser, which is usually held at a constant temperature of about ±0.1° C., this is a very broad temperature interval across which reliable tuning is possible.

As described above, a control device controlling the laser 121 may or may not receive signals from a frequency measurement device. Such signals may be received continuously or intermittently during tuning, so as to create a feedback loop using the control device in order to lock onto a certain desired frequency. The latter frequency may be an absolute, known frequency, the initially determined reference frequency or some other frequency which is determined relative to the said reference frequency. Such a feedback loop thus works by translating the operating point of the laser 121 along the tuning line so as to compensate for a discrepancy between the measured output frequency and the desired output frequency.

The measurement of the output frequency of the laser 121 can also be done indirectly as described above, by measuring whether the light power received at the receiving end 110 is within a certain frequency range. Then, the operating point of the laser 121 can be translated so as to keep the output frequency within the said frequency range.

Such feedback loop may, furthermore, be supplemented by a feed forward procedure as described above, in which the operating point is shifted in response to a temperature shift or the like. This way, the tuning of the laser 121 will be both rapid and exact. For example, when the temperature of the laser increases a certain number of degrees, the operating point can quickly be shifted to a point at which the current lasing frequency is approximately the same as before the temperature increase, using feed forward based upon the known relationship between tuning line position and relative frequency. Thereafter, a wavelength locker can be used to fine-tune the operating point so as to obtain a sufficiently exact output frequency of the laser 121.

For age-induced frequency shifts, a feedback loop is especially useful, since a temperature-based feed forward loop may not accurately predict age-induced frequency shifts.

As mentioned above, the position of the tuning lines 701-703 is to first approximation independent of the laser temperature. In practice, there will be a certain dependence, and in order to keep accuracy it is therefore possible and sometimes desirable to only operate the laser using the identified set of tuning lines 305 when within a certain predetermined temperature interval.

Thus, according to a preferred embodiment the temperature of the laser is continuously or intermittently measured during operation, and the operating point of the laser is updated along the identified tuning lines in response to and correcting for changing laser temperatures, across a temperature range spanning across at least 5° C., more preferably 10° C., most preferably at least 20° C.

In order to achieve precise tuning operation across a broader temperature interval, the laser is, according to one preferred embodiment, preheated to a certain temperature above ambient temperature in an initial step before the calibration step as described above. Then, the laser is kept within a temperature range comprising this elevated temperature during operation by aid of additional heating. Such additional heating can, for example, be performed using a resistor as described above for keeping the laser at an elevated, approximately constant temperature. It is preferred that the preheat temperature is chosen to be so high so that the laser will never reach a higher temperature on its own during normal operation. This way, the same set of identified tuning lines can be used continuously with no need for recalibration.

Alternatively, the laser is operated under temperature surveillance as described above, and recalibrated in case the temperature falls outside of the said temperature interval. Hence, in this case a new set of tuning lines are identified using the above algorithm. In this case, a new temperature range of the above size is established in relation to the new calibration. This way, the laser 121 can be started quickly, and since a calibration could be accomplished relatively quickly, the downtime when switching temperature ranges will in many applications be fully acceptable, in many cases as short as a few seconds or less.

According to one preferred embodiment, the laser is preheated during calibration to a certain elevated preheat temperature, and then, by controlling the temperature using additional heating, the laser temperature is allowed to exceed the preheat temperature during operation but not allowed to fall below the preheat temperature. This way, the temperature differences experienced by the laser are more limited then what would be the case with no additional heating, and fewer recalibrations would be necessary.

According to one preferred embodiment, recalibration is also performed routinely at certain intervals of longer duration, such as monthly or yearly. This way, age-induced drifts etc. can be accounted for in the updated tuning lines.

If uptime is more critical than boot time, the laser may in an initial step be heated so as to assume a number of different consecutive temperatures, each comprised in a respective one of a consecutive series of temperature ranges of the above described size. When assuming each such consecutive temperature, the laser is calibrated, and the resulting tuning lines for each such calibration are stored into the same memory as mentioned above or another similar memory. Then, during operation, the tuning lines stored associated with the temperature range in which the current operating temperature of the laser is comprised are used to set the output frequency of the laser. It is preferred that the temperature in said initial step is increased by between 15° C. and 20° C. between each measurement.

Above, preferred embodiments have been described. However, it is apparent to the skilled person that numerous modifications can be imparted to the described embodiments.

For example, a semiconductor laser having three or more Bragg reflector sections can be calibrated and tuned using the corresponding methodology as described above. In such cases, the amount with which the Bragg currents are to be altered in order to shift the operating point of the laser along a certain tuning line are calculated in a way which is analogous to the one described above for an MGY-SOA laser. The phase current is altered in the corresponding manner. To find tuning lines of lasers of various types is well within the capacity of the skilled person.

Thus, the invention is not limited to the described embodiments, but can be varied within the scope of the enclosed claims.

The invention claimed is:

1. Method for calibrating and tuning a part wise monotonically, continuously tunable semiconductor laser (121;10) comprising at least a phase section (12) and at least a first Bragg reflector section (14a,14b), through which sections a phase current and a first reflector current, respectively, are applied, said method comprising
    a) a calibration step, comprising firstly obtaining at least two tuning lines (301) along which tuning lines all combinations of phase and Bragg currents are stable operating points of the laser (121;10), secondly identifying at least one reference stable operating point along at least a first one of the identified tuning lines (301) at which operating point the laser (121;10) emits light at a certain reference frequency, and thirdly storing into a memory the at least one reference stable operating point; and
    b) a subsequent tuning step, during which the output frequency of the laser (121;10) in relation to the said reference frequency is controlled to a desired output frequency by translating the operating point of the laser (121;10) along the said first tuning line according to a known relationship between relative position along the tuning line and relative laser frequency shift, and, whenever said translation from the said reference operating point is or becomes too great for the operating point to fit along the first tuning line, continuing the translation along another one of the identified tuning lines (301) so as to achieve the desired output frequency.

2. Method according to claim 1, wherein the laser (121;10) is not actively temperature stabilized and wherein the calibration step furthermore comprises measuring the temperature of the laser (121;10) at the point in time when the reference stable operating point was identified and storing into the memory said temperature of the laser (121;10), and wherein the tuning step furthermore comprises continuously measuring the current operating temperature of the laser (121;10) and then translating the operating point of the laser (121;10) so as to compensate for a temperature induced relative shift in output frequency of the laser (121;10) due to a difference between the stored operating temperature and the current operating temperature, where the magnitude of the translation is determined according to a known relationship between temperature shift and translation of the currently used tuning line.

3. Method according to claim 1, wherein the tuning step furthermore comprises intermittently or continuously measuring the output frequency of the laser (121;10) and then translating the operating point of the laser (121;10) along the first tuning line so as to compensate for a discrepancy between the measured output frequency and the desired output frequency.

4. Method according to claim 3, wherein the output frequency of the laser (121;10) is measured using a frequency measurement device which is integrated in the laser module, and wherein the operating point of the laser (121;10) is controlled by a control device accepting an output signal from the frequency measurement device as input parameter.

5. Method according to claim 3, wherein the measurement of the output frequency of the laser (121;10) is done indirectly, by measuring whether the light power received at a target (110) for the light emitted from the laser (121;10) is within a certain frequency range, and wherein the operating point of the laser (121;10) is translated so as to keep the output frequency within the said frequency range.

6. Method according to claim 3, wherein age-induced changes in the light emitted from the laser (121;10) are compensated for by translating the operating point along the first tuning line.

7. Method according to claim 1, wherein, in the tuning step, the same identified tuning line or lines (305) are used across a temperature range spanning across at least 5° C.

8. Method according to claim 7, wherein the laser (121;10) before the calibration step is preheated to a certain preheat temperature above ambient temperature, and during the tuning step is kept within a temperature range comprising the said preheat temperature and spanning across at least 5° C. by additional heating.

9. Method according to claim 8, wherein the temperature of the laser (121;10) during the tuning step is controlled so that it is allowed to exceed the preheat temperature but not allowed to fall below the preheat temperature.

10. Method according to claim 8, wherein the calibration step is repeated in case the temperature falls outside of the said temperature interval, and that a new temperature range is then established before restarting the tuning step.

11. Method according to claim 8, wherein the laser (121;10) in an initial step, before the calibration step, is heated so as to assume a number of different consecutive temperatures, wherein the calibration step is performed at each of said consecutive temperatures, wherein the resulting tuning lines (301) for each such calibration is stored into a memory, and wherein during the tuning step the tuning lines (301) obtained for the current operation temperature of the laser (121;10) are used to set the output frequency of the laser (121;10).

12. Method according to claim 1, wherein in the calibration step the at least one reference operating point is identified by scanning the laser (121;10) along at least the first tuning line and observing a fed back signal (113) from a target (110) for the light emitted from the laser (121;10), which signal (113) carries information about whether the light emitted by the laser (121;10) is within a certain target frequency range, and wherein the reference operating point is identified so as to be indicative of the target frequency range.

13. Method according to claim 12, wherein the target (110) for the light emitted from the laser (121;10) comprises a conventional light detector (111) and wherein at least one conventional optical filter (130) is present between the laser (121;10) and the detector (111), both constituting existing components of an optical communications network (100) in which the laser (121;10) is also a part.

14. Method according to claim 1, wherein in the tuning step, the other one of the identified tuning lines (301) is the subsequent neighbor of the first tuning line.

15. Method according to claim 1, wherein in the tuning step, the transfer from the first tuning line to the other tuning line is accomplished by altering the phase current fed to the laser (121;10) without altering the Bragg currents fed to the laser (121;10).

* * * * *